(12) United States Patent
Bangsaruntip et al.

(10) Patent No.: US 10,546,924 B2
(45) Date of Patent: Jan. 28, 2020

(54) FABRICATION OF NANOMATERIAL T-GATE TRANSISTORS WITH CHARGE TRANSFER DOPING LAYER

(71) Applicant: INTERNATIONAL BUSINESS MACHINES CORPORATION, Armonk, NY (US)

(72) Inventors: Sarunya Bangsaruntip, Mount Kisco, NY (US); Michael Engel, Ossining, NY (US); Shu-Jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 282 days.

(21) Appl. No.: 15/426,677

(22) Filed: Feb. 7, 2017

(65) Prior Publication Data

US 2017/0244055 A1    Aug. 24, 2017

Related U.S. Application Data

(63) Continuation of application No. 15/046,723, filed on Feb. 18, 2016, now Pat. No. 9,748,334.

(51) Int. Cl.
*H01L 29/06* (2006.01)
*H01L 21/28* (2006.01)
(Continued)

(52) U.S. Cl.
CPC .... *H01L 29/0669* (2013.01); *H01L 21/02623* (2013.01); *H01L 21/28114* (2013.01);
(Continued)

(58) Field of Classification Search
CPC ............... H01L 51/057; H01L 29/0669; H01L 51/0048; H01L 21/02606; H01L 21/02603; H01L 21/28114; H01L 21/28587
See application file for complete search history.

(56) References Cited

U.S. PATENT DOCUMENTS 5,120,668 A    6/1992  Hsu et al.
5,966,597 A *  10/1999 Wright .............. H01L 21/28061
                                                257/E21.2
(Continued)

FOREIGN PATENT DOCUMENTS

CN         2015194639 A  *  1/2015

OTHER PUBLICATIONS

List of IBM Patents or Patent Applications Treated as Related dated Feb. 7, 2017, 2 pages.
(Continued)

*Primary Examiner* — Michele Fan
(74) *Attorney, Agent, or Firm* — Tutunjian & Bitetto, P.C.; Vazken Alexanian (57) ABSTRACT

A field effect transistor including a dielectric layer on a substrate, a nano-structure material (NSM) layer on the dielectric layer, a source electrode and a drain electrode formed on the NSM layer, a gate dielectric formed on at least a portion of the NSM layer between the source electrode and the drain electrode, a T-shaped gate electrode formed between the source electrode and the drain electrode, where the NSM layer forms a channel of the FET, and a doping layer on the NSM layer extending at least from the sidewall of the source electrode to a first sidewall of the gate dielectric, and from a sidewall of the drain electrode to a second sidewall of the gate dielectric.

20 Claims, 7 Drawing Sheets

(51) Int. Cl.

| | |
|---|---|
| *H01L 51/05* | (2006.01) |
| *H01L 29/423* | (2006.01) |
| *H01L 29/66* | (2006.01) |
| *H01L 29/78* | (2006.01) |
| *H01L 51/00* | (2006.01) |
| *H01L 21/285* | (2006.01) |
| *H01L 21/02* | (2006.01) |

(52) U.S. Cl.
CPC .... *H01L 21/28587* (2013.01); *H01L 29/0649* (2013.01); *H01L 29/42376* (2013.01); *H01L 29/66477* (2013.01); *H01L 29/66553* (2013.01); *H01L 29/78* (2013.01); *H01L 51/0048* (2013.01); *H01L 51/057* (2013.01); *H01L 51/0541* (2013.01)

(56) References Cited

U.S. PATENT DOCUMENTS

| | | | |
|---|---|---|---|
| 6,656,824 B1* | 12/2003 | Hanafi | H01L 21/28114 257/E21.205 |
| 6,870,232 B1* | 3/2005 | Chan | H01L 27/095 257/330 |
| 6,969,690 B2 | 11/2005 | Zhou et al. | |
| 7,504,132 B2 | 3/2009 | Afzali-Ardakani et al. | |
| 7,692,249 B2 | 4/2010 | Zhang | |
| 7,858,454 B2 | 12/2010 | Kalburge | |
| 7,892,517 B2 | 2/2011 | Tour et al. | |
| 8,138,102 B2 | 3/2012 | Afzali-Ardakani et al. | |
| 8,692,230 B2 | 4/2014 | Zhou et al. | |
| 8,772,782 B2 | 7/2014 | Cao et al. | |
| 8,785,309 B2 | 7/2014 | Kastalsky | |
| 8,859,048 B2 | 10/2014 | Afzali-Ardakani et al. | |
| 8,895,371 B2 | 11/2014 | Cao et al. | |
| 9,748,334 B1* | 8/2017 | Bangsaruntip | H01L 21/02623 |
| 2009/0032804 A1 | 2/2009 | Kalburge | |
| 2009/0117277 A1 | 5/2009 | Afzali-Ardakani et al. | |
| 2010/0330751 A1* | 12/2010 | Choi | B82Y 10/00 438/151 |
| 2012/0248416 A1* | 10/2012 | Zhou | B82Y 10/00 257/29 |
| 2013/0032860 A1 | 2/2013 | Marino et al. | |
| 2013/0082233 A1 | 4/2013 | Afzali-Ardakani et al. | |
| 2014/0008664 A1* | 1/2014 | Kudou | H01L 29/4236 257/77 |
| 2014/0124737 A1* | 5/2014 | Takei | H01L 51/0558 257/29 |
| 2015/0014630 A1 | 1/2015 | Choi et al. | |
| 2015/0102288 A1 | 4/2015 | Hersam et al. | |
| 2015/0179755 A1* | 6/2015 | Rooyackers | H01L 29/42392 257/24 |

OTHER PUBLICATIONS

Badmaev, et al., "Self-Aligned Fabrication of Graphene RF Transistors with T-Shaped Gate", ACS NANO, Mar. 2012, pp. 3371-3376, vol. 6, No. 4.

Cao, et al., "End-bonded Contacts for Carbon Nanotube Transistors With Low, Size-Independent Resistance", Science Magazine, Oct. 2015, pp. 68-72, vol. 350, Issue 6256.

Chandra, et al., "Stable Charge-Transfer Doping of Transparent Single-Walled Carbon Nanotube Films", American Chemical Society, Sep. 2010, pp. 5179-5183.

Chen, et al., "Air Stable n-doping of WSe2 by Silicon Nitride Thin Films With Tunable Fixed Charge Density", ALP Materials, Aug. 2014, 8 Pages.

Ha, et al., "Highly Uniform and Stable n-Type Carbon Nanotube Transistors by Using Positively Charged Silicon Nitride Thin Films", ACS Publications, NANO Letters, Dec. 2014, pp. 392-397.

Jagtiani, et al., "Initial Evaluation and Comparison of Plasma Damage to Atomic Layer Carbon Materials Using Conventional and Low Te Plasma Sources", Journal of Vacuum Science and Technology, Jan. 2016, 10 pages, vol. 34, No. 1.

Li, et al., "Fabrication of Air-stable n-type Carbon Nanotube Thin-film Transistors on Flexible Substrates Using Bilayer Dielectrics", Nanoscale, Sep. 2015, pp. 17693-17701.

Park, et al., "High-density integration of Carbon Nanotubes Via Chemical Self-assembly", Nature Nanotechnology, Letters, Oct. 2012, pp. 787-791.

Tulevski, et al., "Chemically Assisted Directed Assembly of Carbon Nanotubes for the Fabrication of Large-Scale Device Arrays", JACS Articles, Sep. 2007, pp. 11964-11968.

Zhang, et al., "Air-Stable Conversion of Separated Carbon Nanotube Thin-Film Transistors from p-Type to n-Type Using Atomic Layer Deposition of High-κ Oxide and Its Application in CMOS Logic Circuits", ACS NANO, Mar. 2011, pp. 3284-3292, vol. 5, No. 4.

* cited by examiner

FABRICATION OF NANOMATERIAL T-GATE TRANSISTORS WITH CHARGE TRANSFER DOPING LAYER

BACKGROUND

Technical Field

The present invention relates to a semiconductor device structures and more particularly to the fabrication of a transistor structure including nano-structure material (NSM) technology.

Description of the Related Art

Various semiconductor devices have typically been fabricated from silicon and III-V semiconductor materials. A Field Effect Transistor (FET) typically has a source, a channel, and a drain, where current flows from the source to the drain, and the gate controls the flow of current through the channel. Field Effect Transistors (FETs) can have a variety of different structures, for example, FETs have been formed with the source, channel, and drain formed in the substrate material itself, where the current flows horizontally (i.e., in the plane of the substrate), and FinFETs have been formed with the channel extending outward from the substrate, but where the current also flows horizontally. The channel for the FET can be a thin region of silicon or III-V semiconductor with a planar gate on the channel. Depending on the choice of material and doping for the source, channel, and drain, an n-FET or a p-FET may be formed.

SUMMARY

A nanostructure material (NSM) field effect transistor (FET) including a dielectric layer on at least a portion of a substrate, a nano-structure material (NSM) layer on at least a portion of the dielectric layer, a source electrode and a drain electrode formed on at least a portion of the NSM layer, a gate dielectric formed on at least a portion of the NSM layer between the source electrode and the drain electrode, a T-shaped gate electrode formed between the source electrode and the drain electrode on the gate dielectric, wherein the NSM layer forms a channel of the FET, and a doping layer formed directly on the NSM layer extending at least from the sidewall of the source electrode to a first sidewall of the gate dielectric, and at least from a sidewall of the drain electrode to a second sidewall of the gate dielectric.

A method of fabricating a nanostructure material field effect transistor (NSM FET) including forming a NSM layer on at least a portion of dielectric layer, forming a source electrode and a drain electrode on at least a portion of the NSM layer, forming a gate dielectric on at least a portion of the NSM layer between the source electrode and the drain electrode, forming a T-shaped gate electrode between the source electrode and the drain electrode on the gate dielectric, wherein the NSM layer forms a channel of the FET, and forming a doping layer directly on the surface of the NSM layer, where the doping layer extends at least from a sidewall of the source electrode to a first sidewall of the gate dielectric, and at least from a sidewall of the drain electrode to a second sidewall of the gate dielectric.

A method of fabricating a nanostructure material field effect transistor (NSM FET) including forming a dielectric layer on at least a portion of a substrate; forming a NSM layer on at least a portion of dielectric layer, wherein the NSM layer includes single-walled carbon nanotubes (SWNTs), double-walled carbon nanotubes (DWNTs), multi-walled carbon nanotubes (MWNTs), chemically modified carbon nanotubes, or graphene; patterning the NSM layer to leave gaps between adjacent sections of NSM material to form a plurality of isolated active areas; forming a source electrode and a drain electrode on at least a portion of the NSM layer forming an isolated active area; forming a gate dielectric on the portion of the NSM layer between the source electrode and the drain electrode; forming a T-shaped gate electrode between the source electrode and the drain electrode on the gate dielectric, wherein the NSM layer forms a channel of the FET; and forming a doping layer directly on the surface of the NSM layer, where the doping layer extends at least from a sidewall of the source electrode to a first sidewall of the gate dielectric, and at least from a sidewall of the drain electrode to a second sidewall of the gate dielectric.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Principles and embodiments of the present disclosure relate generally to a semiconductor structure including nano-structure materials (NSM), where the NSMs form a layer of the structure. The semiconductor structure may be a part of an RF circuit or form a complete semiconductor device (e.g., an RF transistor). In various embodiments, the semiconductor device may be a transistor, or more particularly a field effect transistor (FET). The NSM transistor may be a radio frequency (RF) device. A plurality of RF devices may form an RF circuit. It is also contemplated that two or more semiconductor devices may also be combined to form a logic device, for example, a CMOS device.

Principles and embodiments also relate to a field effect transistor having a channel including carbon nanotubes, where the carbon nanotubes are in electrical connection with a source and a drain of the FET, and a gate is on the channel between the source and drain. The gate of the FET can be T-shaped to decrease parasitic capacitance between the gate, source and drain. A doping layer may be self-aligned with the gate.

It should be understood that reference to carbon nanotubes (CNTs) is a non-limiting example for descriptive purposes only and intended to encompass the different varieties of 1-D and 2-D nano-structure materials, where the nano-structures may be based on carbon and non-carbon materials, including but not limited to single-walled nanotubes (SWNTs), double-walled nanotubes (DWNTs), multi-walled nanotubes (MWNTs), chemically modified nanotubes (e.g., nitrogen-doped CNTs, functionalized CNTs), semiconducting nanowires (e.g., Si—, SiGe—, GaSb—, II-VI, III-V-nanowires), 2-dimensional lattices (e.g., graphene, phosphorene, molybdenum sulfide ($MoS_2$), tungsten selenide ($WSe_2$)), etc. In various embodiments, the nano-structure material composition may include carbon (C), boro-carbon nitrides (e.g., $BC_2N$), black phosphorus (e.g., phosphorene), transition metal dichalcogenides (e.g., $MoS_2$, $WS_2$, $MoSe_2$, $WSe_2$, $MoTe_2$, $NbSe_2$, etc.), group IV semiconductors (e.g., Si, Ge, SiGe), II-VI semiconductors (e.g., ZnO, MgO), and III-V semiconductors (e.g., GaAs, InP, InGaAs).

In one or more embodiments, a FET channel may be formed by one or more CNTs longer than the distance between the source and drain arranged in parallel, wherein each nanotube bridges the source and drain directly without crossing each other. In one or more embodiments, a FET channel may be formed by one or more CNTs longer than the distance between the source and drain arranged in random, wherein each nanotube bridges the source and drain directly but may cross each other. In various embodiments, the CNTs may be individual CNTs, or a plurality of CNTs may form one or more bundle(s) of adjacent CNTs.

In one or more embodiments, a FET channel may be formed by many CNTs arranged in parallel tracks, where each track comprises a series of connected CNTs shorter than the distance between the source and drain that form a relay bridging the source and drain. In one or more embodiments, 1-D nanotubes may form a FET channel as a random arrangement (i.e., a mesh, a mat) that forms a connected network that electrically bridges a source and drain. In various embodiments, a sufficient quantity of nanotubes shorter than the distance between the source and drain may be deposited to reach a percolation threshold for current to flow between a source and drain. A single nanotube spanning the distance between the source and drain may be sufficient to reach a percolation threshold.

In various embodiments, a combination of nanotubes shorter than the distance between the source and drain and nanotubes longer than the distance between the source and drain may form a FET channel that electrically bridges the source and drain.

In one or more embodiments, a 2-D structure (e.g., graphene, phosphorene, etc.) in a single or multi-layer arrangement may form a channel that electrically bridges the source and drain.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs).

Figure 1:
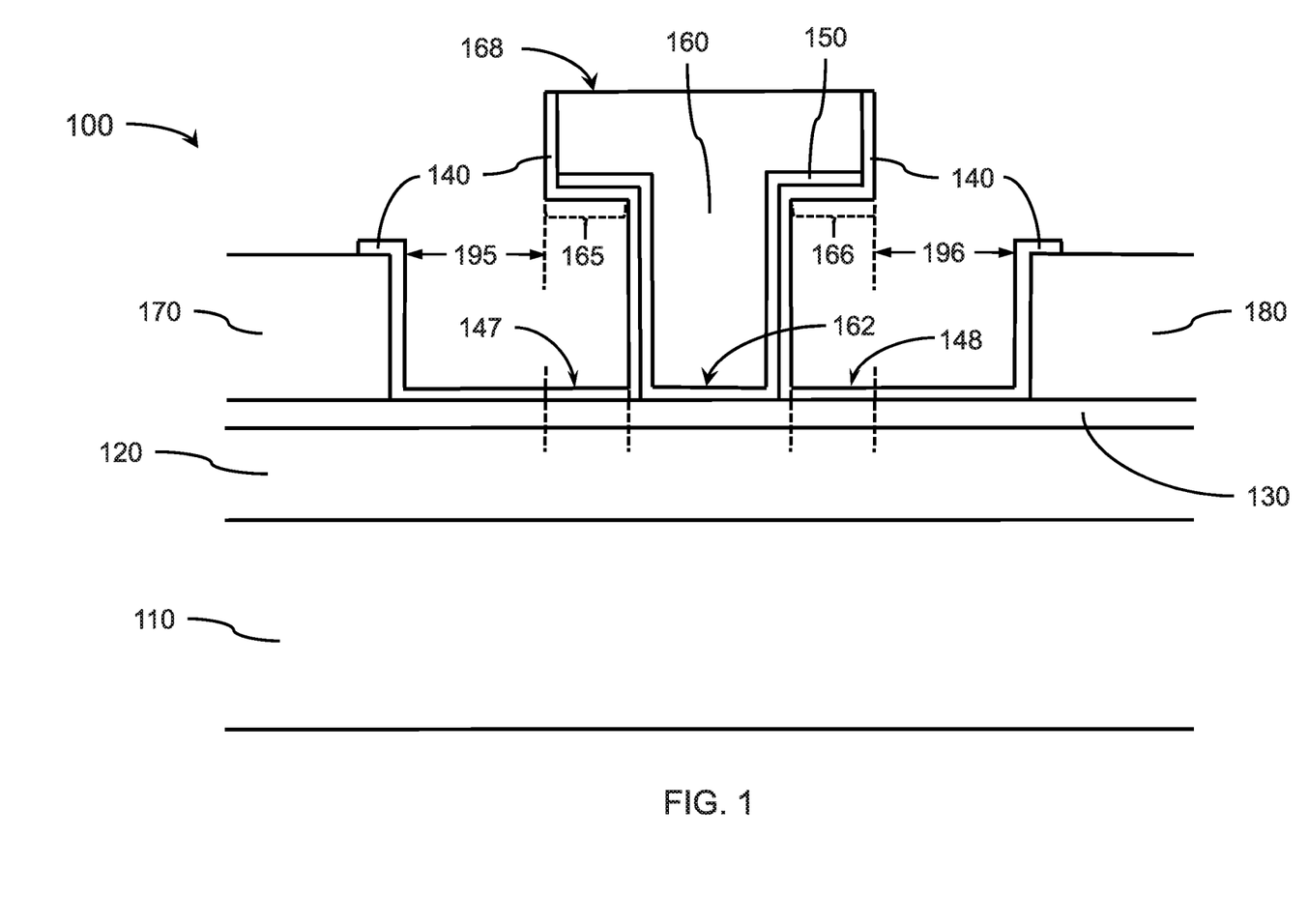
FIG. 1 is a cross-sectional diagram of a NSM FET in accordance with an exemplary embodiment.

Referring now to the drawings in which like numerals represent the same or similar elements and initially to FIG. 1, which is a cross-sectional diagram of a NSM FET having a T-shaped gate (also referred to herein as a T-gate) in accordance with an exemplary embodiment.

In one or more embodiments, a nano-structure material field effect transistor (NSM FET) 100 includes a substrate 110 having a dielectric layer 120 on at least a portion of the substrate 110 and a NSM layer 130 on at least a portion of the dielectric layer 120, where the NSM layer 130 can form a NSM channel of the FET. In various embodiments, the NSM may be carbon nanotube(s). A source electrode 170 and a drain electrode 180 may be physically on and in electrical contact with the NSM layer 130 to form a conductive path from the source electrode 170 to the drain electrode 180, where the NSM layer electrically couples the source electrode 170 to the drain electrode 180.

In various embodiments, the gate electrode 160 is formed on at least a portion of the NSM layer 130, where the gate electrode 160 has a T-shape in which the bottom surface 162 of T-shaped gate electrode 160 on the NSM layer 130 has a smaller width and surface area than the top surface 168 of the gate electrode to thereby form an overhang region(s) 165 and 166 on opposite sides of the vertical leg of the gate electrode. Shadowed region(s) 147, 148 may occur on the surface opposite the overhang region(s) 165, 166, where the shadowed regions 147, 148 may not have a vertical line of sight (as shown in FIG. 1) through gap opening(s) 195, 196 to the surface.

In one or more embodiments, the vertical leg of a T-shaped gate electrode 160 does not extend laterally to the source electrode 170 and/or drain electrode 180. In various embodiments, the horizontal cap of the T-shaped gate electrode 160 does not extend over the source electrode 170 and/or drain electrode 180. In some embodiments, the horizontal cap of the T-shaped gate electrode 160 may partially extend over the source electrode 170 and/or drain electrode 180. There may be gap openings 195, 196 between the T-shaped gate electrode 160 and the source electrode 170 and/or drain electrode 180.

In one or more embodiments, a gate dielectric layer 150 may be located between the gate electrode 160 and the NSM layer 130, where the gate dielectric 150 electrically insulates the gate electrode 160 from the conductive NSM layer 130. The gate dielectric 150 may extend up the sidewall(s) of the gate electrode 160 to provide a physical barrier and/or electrical insulation between the gate electrode 160 and the doping layer 140 along these side surfaces.

In various embodiments, a doping layer 140 may be on at least a portion of the exposed surfaces of the source electrode 170, the drain electrode 180, the NSM layer 130, and the gate electrode 160. The doping layer 140 may be formed on the sidewall(s) of the gate electrode 160 and cover at least a portion of the gate dielectric layer 150. The doping layer 140 may be formed on at least a sidewall of the source electrode 170 and at least a sidewall of the drain electrode 180.

In various embodiments, the doping layer 140 may include benzyl viologen, a silicon nitride ($Si_xN_y$) film, a magnesium oxide film (MgO), a high-K dielectric metal oxide film (e.g., $Al_2O_3$, $HfO_2$), or combinations thereof. In one or more embodiments, the doping layer 140 is benzyl viologen or silicon nitride. The NSM layer 130 may be n-doped or p-doped by the doping layer 140.

In various embodiments, the NSM layer 130 may be n-type or p-type based on the associated work function of the source and/or drain material (e.g., p-type formed by un-doped CNT with Pd as the source/drain material, n-type formed by un-doped CNT with Sc as the source/drain material).

Figure 2:
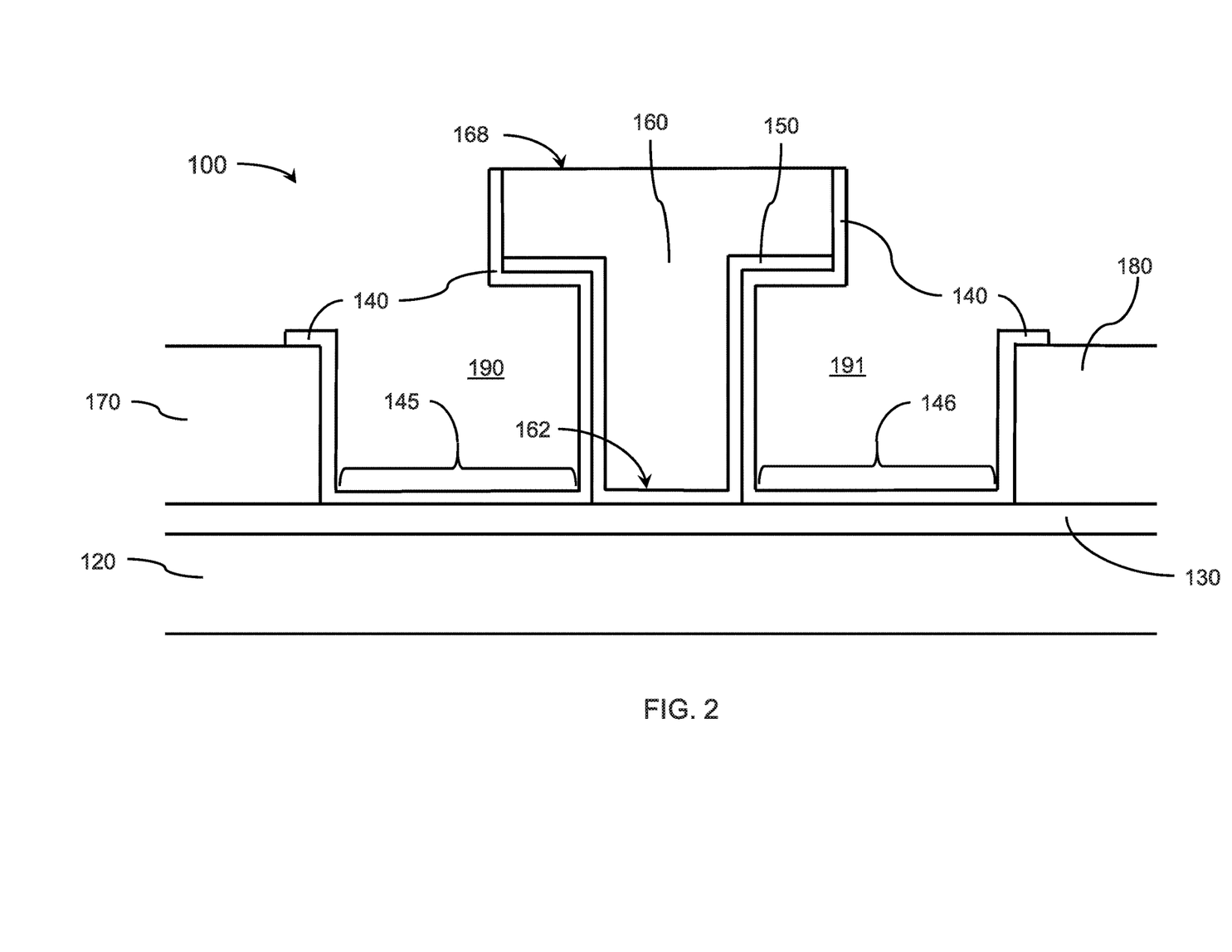
FIG. 2 is a cross-sectional diagram of the NSM FET device showing an enlarged view of the source-gate-drain portion in accordance with an exemplary embodiment.

FIG. 2 is a side view of the cross-sectional diagram of the NSM FET device in FIG. 1 showing an enlarged view of the source-gate-drain portion in accordance with an exemplary embodiment of device 100.

In one or more embodiments, the bottom surface 162 of the T-shaped gate electrode 160 does not extend to the source electrode 170 and/or drain electrode 180, such that the NSM layer 130 may be covered only by doping layer 140 along extension portion(s) 145, 146 between source electrode 170 and gate electrode 160, and/or drain electrode 180 and gate electrode 160 respectively. The doping layer 140 may cover the entire extension portion 145 of the NSM layer 130 between the source electrode 170 and gate electrode 160, where the doping layer 140 extends laterally at least from the edge of the source electrode 170 to the gate dielectric layer 150 on the sidewall of the gate electrode 160 including the shadowed region 147. The doping layer 140 may cover the entire extension portion 146 of the NSM layer 130 between the drain electrode 180 and gate electrode 160, where the doping layer 140 extends laterally at least from the edge of the drain electrode 180 to the gate dielectric layer 150 on the side of the gate electrode 160 including shadowed region 148.

The overhanging region(s) 165, 166 also may not extend over the source electrode 170 and/or drain electrode 180. There may be a gap region 190, 191 between and bounded by the T-shaped gate electrode 160, NSM layer 130, and source electrode 170 on one side of the gate electrode 160, and by the gate electrode 160, NSM layer 130, and drain electrode 180 on an opposite side of the gate electrode 160.

The doping layer 140 may cover portions of the NSM layer 130, gate electrode 160, source electrode 170, and drain electrode 180.

In one or more embodiments, the bottom surface 162 of the T-shaped gate electrode 160 may have a width in the range of about 5 nm to about 500 nm, or in the range of about 5 nm to about 250 nm, or in the range of about 10 nm to about 200 nm, thereby forming a gate length in the range of in the range of about 5 nm to about 500 nm, or in the range of about 5 nm to about 250 nm, or in the range of about 10 nm to about 200 nm.

In one or more embodiments, the top surface 168 of the T-shaped gate electrode 160 may have a width and surface area greater than the bottom surface 162 of the T-shaped gate electrode, such that overhanging region(s) 165, 166 extend laterally a distance greater than the width of the bottom surface 162 of the T-shaped gate electrode.

In various embodiment, the overhanging region(s) 165 extend about 2 nm to about 1000 nm, or about 2 nm to about 500 nm, or about 2 nm to about 100 nm, or about 5 nm to about 100 nm, or about 5 nm to about 50 nm beyond the sidewall of the vertical leg of the T-shaped gate electrode 160. In various embodiments, the ratio of the width of the top surface to the width of the bottom surface is in the range of about 1.2:1 to about 20:1, or in the range of about 1.2:1 to about 10:1, or in the range of about 1.2:1 to about 5:1, or in the range of about 1.4:1 to about 4:1, or in the range of about 1.4:1 to about 3:1, or in the range of about 1.8:1 to about 3:1 although other ratios achievable by fabrication processes, as discussed herein, are contemplated.

In various embodiments, the overhanging region(s) 165, 166 extend laterally a distance less than the length of extension portion(s) 145, 146, such that the overhanging region(s) 165, 166 do not extend over source electrode 170 and/or drain electrode 180 to control capacitances. The overhanging region 165 may be the same length as the overhanging region 166, or the overhanging region 165 may have a different length than the overhanging region 166, where the difference in length between 165 and 166 may depend on the control of the patterning process.

In one or more embodiments, the vertical leg of the T-shaped gate electrode 160 may have a height from the bottom surface 162 to the overhang region(s) 165, 166 in the range of about 5 nm to about 200 nm, or in the range of about 5 nm to about 100 nm, or in the range of about 10 nm to about 50 nm. In various embodiments, the height of the horizontal cap of the T-shaped gate electrode from the overhang region(s) to the top surface 168 may be in the range of about 2 nm to about 100 nm, or about 5 nm to about 75 nm, or about 10 nm to about 50 nm. In various embodiments, the ratio of the height of the horizontal cap to the height of the vertical leg may be may be in the range of about 0.1:1 to about 5:1, or about 0.2:1 to about 2.5:1, or about 0.5:1 to about 1.5:1, or about 0.75:1 to about 1.25:1, or about 1:1, although other ratios achievable by fabrication processes, as discussed herein, are contemplated.

The extension portion(s) 145, 146 of doping layer 140 may have a length in the range of about 2 nm to 100 nm, about 5 nm to 75 nm, or in the range of 10 nm to 50 nm, such that there is a gap region 190 between the sidewall of source electrode 170 and the sidewall of the vertical leg of the T-shaped gate electrode 160 in the range of about 2 nm to about 100 nm. The extension portion 145 may be the same length as the extension portion 146, or the extension portion 145 may have a different length than the extension portion 146, where the difference in length between 145 and 146 may depend on the control of the patterning process. It should be noted that the dimensions may be exaggerated in the figures to illustrate particular features, such that the figures should not be considered to be to scale, except where expressly stated.

In various embodiments, the formation of gap regions(s) 190, 191 and extension portion(s) 145, 146 may reduce a parasitic capacitance of the source-gate and/or drain-gate regions, since there is an added void, which may be an ultra-low K gap (e.g., vacuum, air, airgap, aerogel, xerogel, etc.), between the source electrode 170 and gate electrode 160 and/or drain electrode 180 and gate electrode 160. In addition the wider top surface 168 of the gate electrode 160 may reduce the gate resistance of a gate line.

Figure 3:
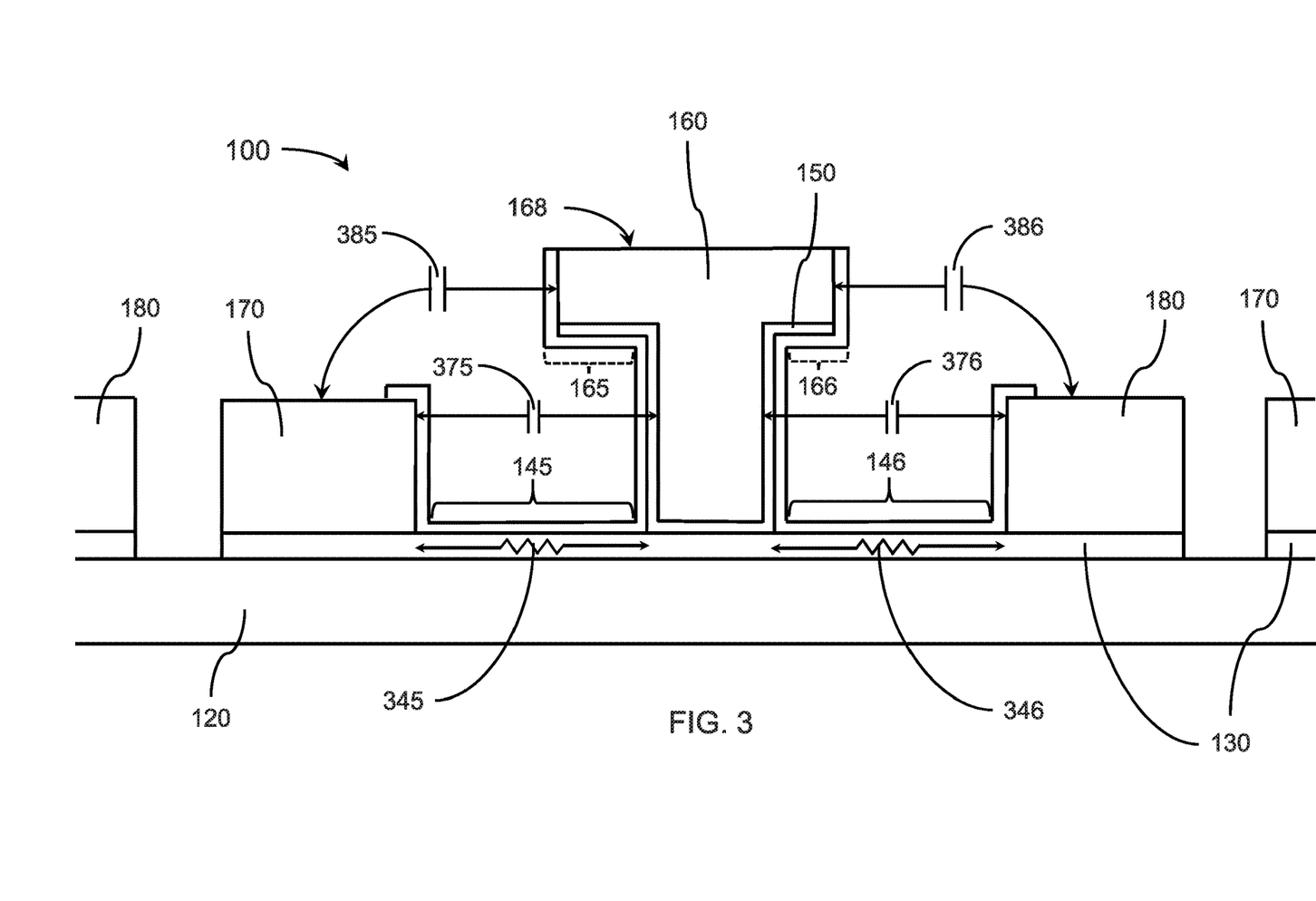
FIG. 3 is a cross-sectional diagram of a NSM FET illustrating electrical aspects of the structure in accordance with an exemplary embodiment.

FIG. 3 is a cross-sectional diagram of a NSM FET illustrating electrical aspects of the structure in accordance with an exemplary embodiment.

In various embodiments, the physical arrangement of the T-shaped gate electrode 160 with the source electrode 170 and drain electrode 180 determines the capacitances and resistances between the components. Without being bound by theory, it is believed that adjusting the lengths of the extension portions 145, 146 and the height and widths of the T-shaped gate, and thereby the dimensions of the gap regions 190, 190, the parasitic capacitances 375, 376, 385, 386 of the device 100 can be reduce to improve high frequency performance. In various embodiments, increasing the distances between the gate electrode 160 and the source 170 and/or drain electrode 180, either by locating the source electrode 170 and/or drain electrode 180 further away from the gate electrode sidewalls, or reducing the width of the base of the T-shaped gate electrode 160 to have a narrower bottom surface 162, such that extension portion(s) 145, 146 are longer, may decrease the capacitance(s) 375, 376. Adjusting the width of the top of the T-shaped gate electrode may adjust the parasitic capacitance(s) 385, 386. In various embodiments, an air gap or an ultra-low K dielectric fill of gap region 190 may be used to help decrease the capacitance 375. An air gap or an ultra-low K dielectric fill of gap region 191 may be used to help decrease the capacitance 376. In addition, since the extension portions 145, 146 are not directly gated, the conductance in the regions may be made as high as possible. Decreasing the length and increasing the conductance of the extension portions 145, 146 may reduce the access resistances 345, 346. Having a wider top surface 168 of the T-shaped gate electrode 160 than the bottom surface 162 may reduce the gate resistance of the T-shaped gate electrode 160. Reducing the parasitic capacitances and/or gate resistance and/or access resistances may produce an RF transistor that can operate at a higher frequency (i.e., a faster device).

In one or more embodiments, the doping layer 140 along extension portion(s) 145, 146 between source electrode 170 and gate electrode 160 and/or drain electrode 180 and gate electrode 160 may reduce access (or external) resistance(s) of the device 100.

In one or more embodiments, end-bonded contacts to the CNTs may be formed at the source electrode 170 and/or drain electrode 180, which may act to largely reduce the parasitic capacitance.

Figure 4:
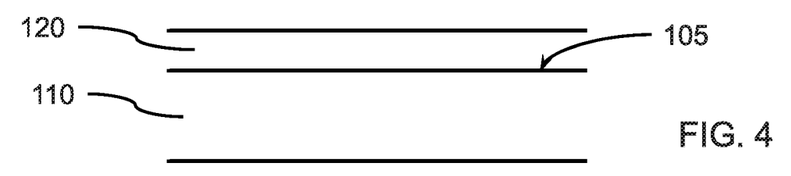
FIG. 4 is a side view of a substrate and a dielectric layer formed on the substrate in accordance with an exemplary embodiment.

FIG. 4 is a side view of a substrate 110 and a dielectric layer 120 formed on the substrate in accordance with an exemplary embodiment.

In one or more embodiments, a substrate 110 may be a semiconductor or an insulator. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may be a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In an embodiment, the substrate is a single crystal silicon wafer.

The dielectric layer 120 may be formed on the exposed surface 105 of the substrate 110, where the dielectric layer 120 may be formed by thermal oxidation of the substrate, one or more deposition processes (e.g., physical vapor deposition, chemical vapor deposition, atomic layer deposition), spin coating, or combinations thereof. The dielectric layer 120 and exposed surface 105 of substrate 110 may form an interface, where the dielectric layer 120 and exposed surface 105 are in contact.

Figure 5:
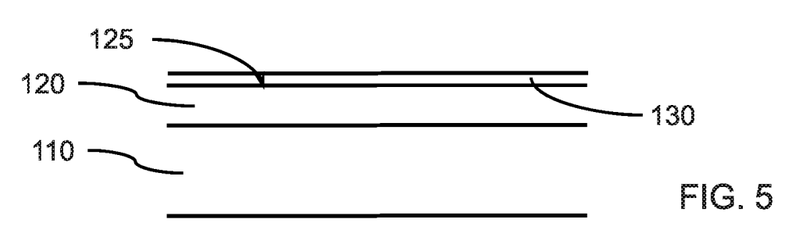
FIG. 5 is a side view of a substrate and dielectric layer with a nano-structure material (NSM) layer on the surface of dielectric layer, as shown in FIG. 4, in accordance with an exemplary embodiment.

FIG. 5 is a side view of a substrate 110 and dielectric layer 120 with a nano-structure material (NSM) layer 130 formed on the surface 125 of dielectric layer 120, as shown in FIG. 4.

In one or more embodiments, the NSM layer 130 may be placed on the surface 125 of dielectric layer 120 by a wet method, where NSM is deposited from a solution. The NSM may be spin coated onto the surface 125, deposited by a drop-and-dry method, or soaked in a solution containing the NSM and rinsed to leave an NSM layer 130. The NSM layer 130 may be deposited over the entire surface 125 of dielectric layer 120, and portions subsequently removed, or the NSM layer 130 may be selectively deposited onto portions of the surface 125 of dielectric layer 120. In various embodiments, the surface 125 of dielectric layer 120 and/or CNTs forming the NSM layer 130 may be functionalized prior to formation of the NSM layer 130 to control selectivity of the CNT deposition and/or improve yield and/or adhesion. In various embodiments, the functionalized surface layer 127 may have a thickness in the range of about 0.5 nm to about 10 nm, or in the range of about 0.5 nm to about 5 nm, as shown in FIG. 14.

Figure 14:
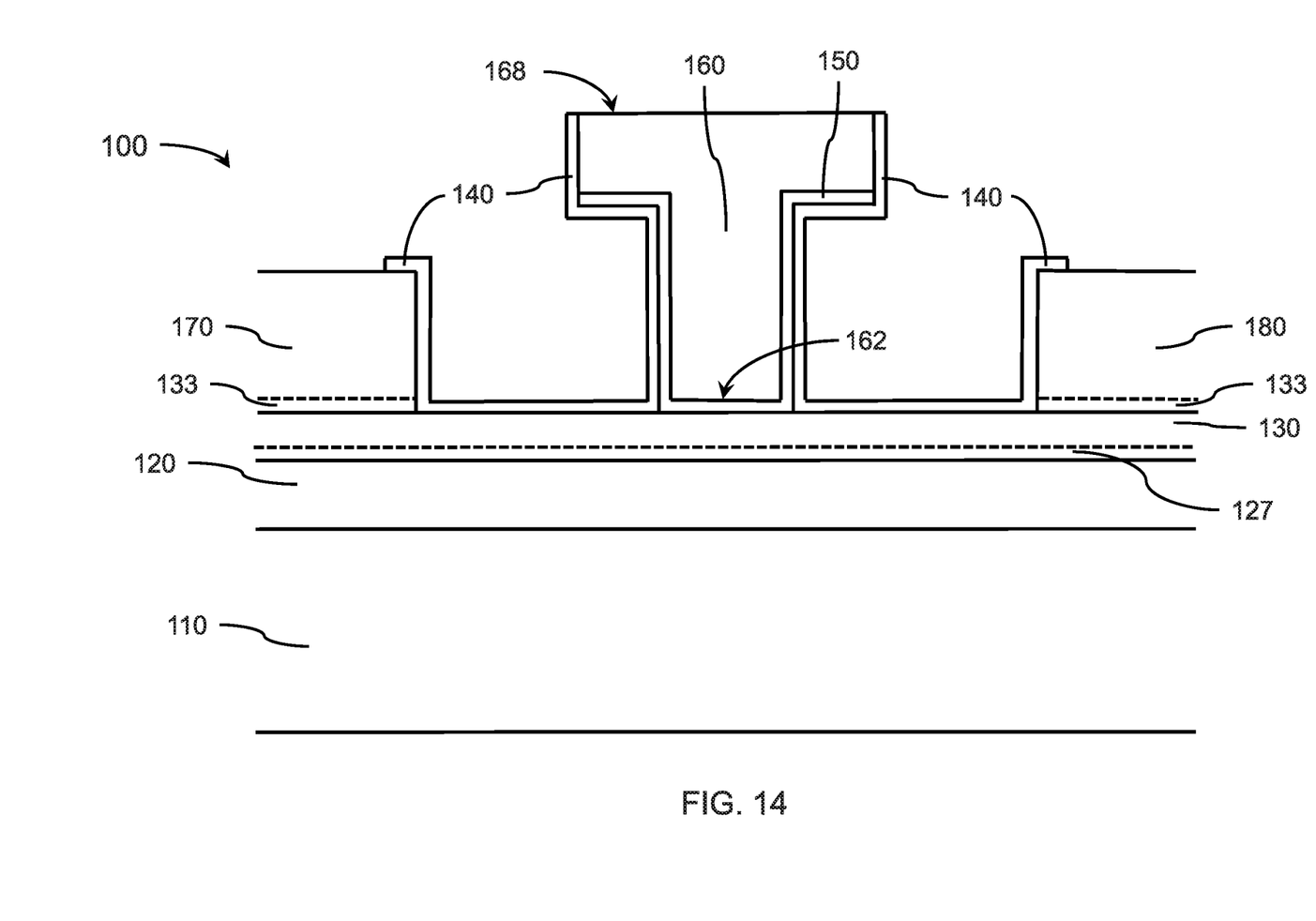
FIG. 14 is a cross-sectional diagram of a NSM FET in accordance with an exemplary embodiment.

In various embodiments, a wetting layer 133 may be formed on at least a portion of the NSM layer 130 prior to formation of the source electrode 170 and/or drain electrode 180, where the wetting layer may be titanium or molybdenum, as shown in FIG. 14. The wetting layer formed on the NSM layer 130 may be positioned between the NSM layer and the source electrode 170 and/or drain electrode 180 to increase adhesion of the electrode(s) 170, 180 to the dielectric layer 120 and/or NSM layer 130. The NSM layer 130 may have increase adhesion to the wetting layer compared to the interaction of the NSM layer 130 directly with the electrode material. In various embodiments, the surface of the dielectric layer 120 may be functionalized to increase adhesion of the NSM layer 130, and/or a wetting layer may be formed on at least a portion of the NSM layer to increase adhesion of the source and drain electrodes, where the wetting layer may also be on an underlying portion of the dielectric surface if the NSM layer is a sub-monolayer.

In various embodiments, the wetting layer may be a sub-monolayer with have a thickness in the range of about 0.5 nm to about 2 nm. A wetting layer may be formed on at least a portion of NSM layer 130 before subsequent materials are deposited on the NSM layer 130 to improve adhesion.

In one or more embodiments, the NSM layer may include carbon nanotubes (CNTs) or graphene. The carbon nanotubes or graphene may be aligned or closely aligned in a direction that will be parallel to the axis between a source and drain of the CNT FET.

In an embodiment, a single CNT may span the distance between the source electrode and the drain electrode to provide a conductive path.

In an embodiment, a plurality of CNTs may be in parallel, where each CNT spans the distance between the source electrode and the drain electrode to provide a conductive path.

In an embodiment, a plurality of CNTs may be shorter than the length between the source electrode and the drain electrode, but make up a random arrangement of the CNTs that are in electrical contact to form a conductive network between the source electrode and the drain electrode. The CNTs have a sufficient density to reach a percolation threshold.

In an embodiment, a FET channel may be formed by a combination of CNTs having sufficient length to span the distance between the source electrode and the drain electrode, and shorter CNTs that form a conductive interconnected network.

In an embodiment, a FET channel may be formed by a 2-dimensional material (e.g., graphene), in a single- or multi-layer arrangement, spanning the distance between the source electrode and the drain electrode to provide a conductive path.

In various embodiments, the NSM layer 130 made of CNTs may have a thickness in the range of about 0.5 nm to about 10 nm, or in the range of about 0.5 nm to about 1.5 nm, or in the range of about 1 nm to about 3 nm, or in the range of about 2 nm to about 5 nm. The thickness of the CNT layer may depend on the type of nanotube structure deposited, where a sub-monolayer of single walled carbon nanotubes may have a thickness of about 0.5 nm to about 1.5 nm determined by the diameter of the CNTs used to form the layer. In a sub-monolayer, nanotubes may only have electrical overlap in-plane without stacking or overlapping vertically. A monolayer of nanotubes may have a thickness in the range of about 1 nm to about 3 nm, where two or more nanotubes may stack or overlap vertically, thereby increasing the layer thickness. A CNT layer of multi-walled nanotubes may have a thickness in the range of about 2 nm to about 5 nm, as determined by the diameter of the multi-walled nanotubes and the extent of overlap. In various embodiments, a tangled mesh of nanotubes may be deposited having a thickness up to about 10 nm. In one or more embodiments, CNTs having sufficient length to span the distance between a source electrode and a drain electrode may be deposited.

In one or more embodiments, the NSM layer 130 may be formed over most (e.g., 90%, 95%, 99%) of surface 125 of dielectric layer 120, and subsequently patterned to form the active areas of one or more FETs. This can be accomplished, for example, using a compatible resist (e.g., poly-methyl methacrylate (PMMA)) that may be patterned over the NSM layer 130 to form exposed portions of the NSM layer 130, where the PMMA may be patterned by an electron beam. The exposed portions of the NSM layer 130 may be removed by cutting or selectively etching, and the resist material subsequently removed. The NSM layer 130 may be patterned to leave gaps between adjacent sections of NSM material to form a plurality of isolated pads or active areas for individual devices. In various embodiments, a hydrogen silsesquioxane (HSQ) material may be patterned by an electron beam to form protected portions of the NSM layer 130.

Figure 6:
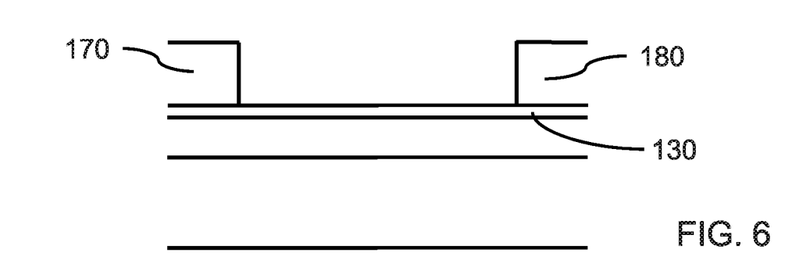
FIG. 6 is a side view of a substrate, dielectric layer, and NSM layer with a source electrode and a drain electrode on the NSM layer, as shown in FIG. 5, in accordance with an exemplary embodiment.

FIG. 6 is a side view of a substrate 110, dielectric layer 120, and NSM layer 130 with a source electrode 170 and a drain electrode 180 formed on at least a portion of the NSM layer 130, as shown in FIG. 5.

In one or more embodiments, the source electrode 170 and drain electrode 180 may be formed of the same material. The source electrode 170 and/or drain electrode 180 may be titanium (Ti), titanium nitride (TiN), tungsten (W), palladium (Pd), gold (Au), scandium (Sc), nickel (Ni), molybdenum (Mo), etc., or combinations thereof. Nickel or molybdenum may form carbides at the interface with a carbon based NSM layer 130. In various embodiments, the source electrode 170 and drain electrode 180 may be formed by physical vapor deposition (PVD), chemical vapor deposition (CVD), atomic layer deposition (ALD), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). In one or more embodiments, source electrode 170 and drain electrode 180 is deposited by PECVD or PVD (e.g., sputtering).

In various embodiments, formation of a layer or electrode may be by one or more deposition processes, where, for example, a conformal layer or wetting layer may be formed by a first process (e.g., ALD, PE-ALD, etc.) and a fill or bulk deposition may be formed by a second process (e.g., CVD, electrodeposition, PVD, etc.).

In various embodiments, the source electrode 170 and/or drain electrode 180 are formed directly on the CNT layer 130 and have an electrical connection at the interface with the CNT layer 130. The CNT layer 130 may be masked prior to deposition of the source electrode 170 and drain electrode 180, such that areas for deposition of the electrodes are exposed and the portions of the NSM layer 130 forming the channels are covered by a resist (e.g., PMMA). The resist may be removed to expose the underlying NSM layer 130 for forming a gate structure on the NSM layer 130. The gate structure (e.g., gate dielectric and gate electrode) may be patterned independently of the source electrode 170 and drain electrode 180.

Figure 7:
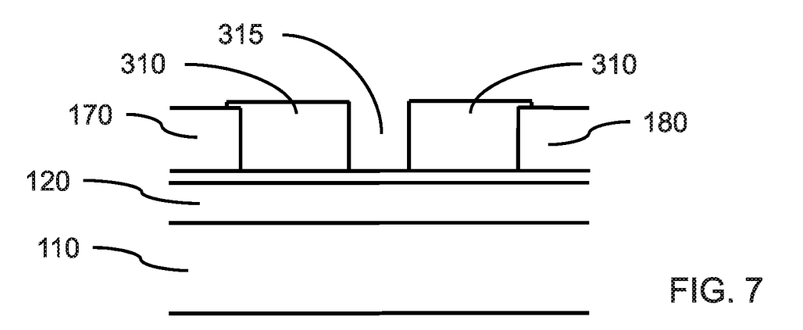
FIG. 7 is a side view of a partially fabricated NSM FET, as shown in FIG. 6, in accordance with an exemplary embodiment.

FIG. 7 is a side view of a partially fabricated NSM FET, as shown in FIG. 6.

In one or more embodiments, the source electrode 170 and drain electrode 180 and exposed surface of the NSM layer 130 may be masked and patterned to leave portions of the source electrode 170, drain electrode 180, and NSM layer 130 available for deposition of a sacrificial spacer material 310.

In one or more embodiments, a block of sacrificial spacer material 310 may be patterned over the NSM layer 130, where the block covers at least a portion of the top surface of the source electrode 170, while another block of sacrificial spacer material 310 may be patterned over the NSM layer 130, where the block covers at least a portion of the top surface of and the drain electrode 180, thereby forming a recess 315 between the two blocks. The sacrificial spacer material 310 may form sacrificial blocks by selectively curing portions of the sacrificial spacer material 310.

In one or more embodiments, the sacrificial spacer material 310 may first be deposited over the source electrode 170, the exposed surface of the NSM layer 130, and drain electrode 180. A recess 315 may then be created by removing the sacrificial spacer material 310 from a region of the sacrificial spacer material 310. The gate structure is patterned independently of the source electrode 170 and drain electrode 180. As such, the extension distances 146, 146 may not necessarily be equal.

In various embodiments, sacrificial spacer material 310 may be hydrogen silsesquioxane (HSQ) having a chemical formula of $HSiO_{3/2}$, for example, $H_8Si_8O_{12}$. In various embodiments, sacrificial spacer material 310 covers at least a portion of the top surfaces of the source electrode 170 and the drain electrode 180. In various embodiments, the HSQ may be patterned via an electron beam, where the electron-beam exposed regions form the sacrificial blocks, while unexposed regions of the HSQ layer may be developed to remove the unexposed material to form, for example, recess 315. The HSQ of the sacrificial spacer material 310 may be further hardened (e.g., by annealing) to form $SiO_2$.

Figure 8:
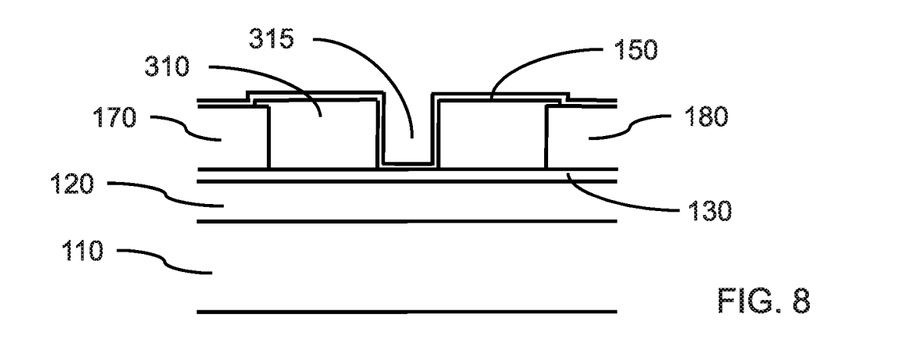
FIG. 8 is a side view of a partially fabricated NSM FET, as shown in FIG. 7, in accordance with an exemplary embodiment.

FIG. 8 is a side view of a partially fabricated NSM FET, as shown in FIG. 7.

In various embodiments, a gate dielectric layer 150 may be formed over the exposed surfaces of the source electrode 170, drain electrode 180, sacrificial spacer material 310, and NSM layer 130. In various embodiments, gate dielectric layer 150 may be silicon oxide ($SiO_2$), silicon nitride (e.g., $Si_3N_4$), or a high-k dielectric material, where the high-k oxide may be $HfO_2$, $HfSiO_4$, $HfSiON$, $La_2O_3$, $Ta_2O_5$, $ZrO_2$, and/or $SrTiO_3$, or combinations thereof. The stoichiometry of the materials may vary.

In various embodiments, the gate dielectric layer 150 may be formed by ALD, CVD, or combinations thereof, where the gate dielectric layer may be formed a temperatures in the range of about 80° C. to about 600° C., or more particularly at low temperatures in the range of about 80° C. to about 150° C., or about 100° C. to about 130° C. The gate dielectric layer 150 may have a thickness in the range of about 1 nm to about 5 nm, or about 1 nm to about 3 nm, or about 2 nm. In various embodiments, the gate dielectric layer 150 may subsequently be annealed.

Figure 9:
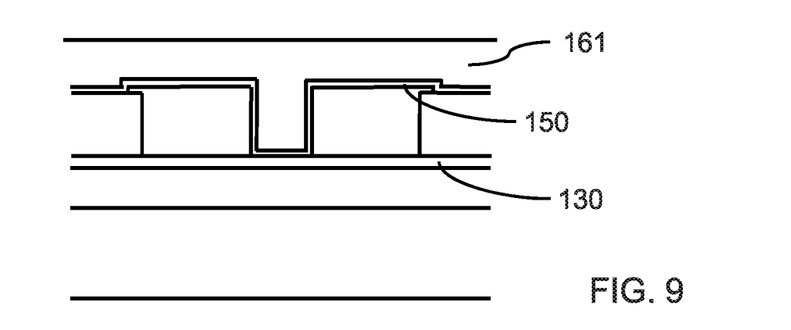
FIG. 9 is a side view of a partially fabricated NSM FET, as shown in FIG. 8, in accordance with an exemplary embodiment.

FIG. 9 is a side view of a partially fabricated NSM FET, as shown in FIG. 8.

In one or more embodiments, a gate electrode material 161 may be formed over the gate dielectric layer 150, and fill in recess(es) 315 between sacrificial spacer material 310. The gate electrode material 161 may extend substantially above the surface of the gate dielectric layer to provide sufficient material to be etched and/or chemically-mechanically polished back to remove any dimpling caused by the gate electrode recess between sacrificial spacer material 310.

Figure 10:
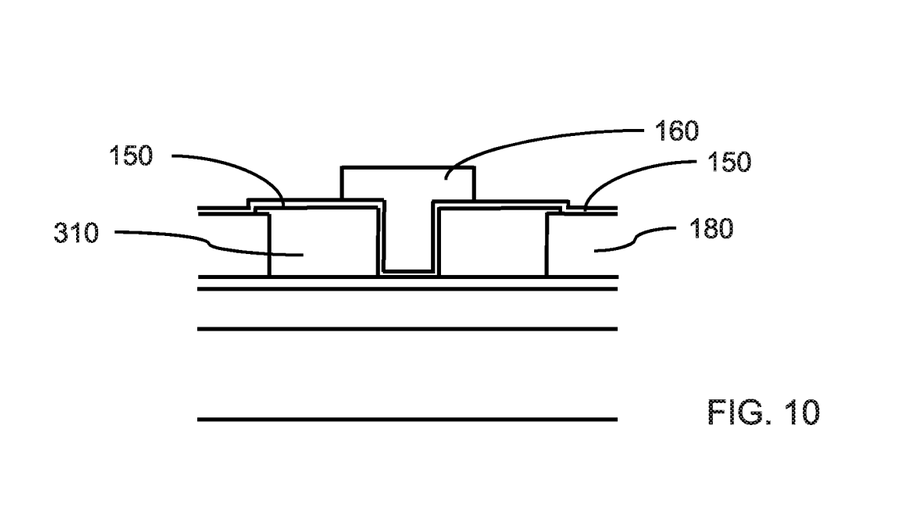
FIG. 10 is a side view of a partially fabricated NSM FET, as shown in FIG. 9, in accordance with an exemplary embodiment.

FIG. 10 is a side view of a partially fabricated NSM FET, as shown in FIG. 9.

In various embodiments, the gate electrode material 161 may be masked, patterned, and etched to form a gate electrode 160, where gate material 161 may be removed to form the top of the T-shaped gate electrode 160.

In various embodiments, the gate electrode 160 may be formed by patterning an opening in a temporary resist (e.g., PMMA) and/or hard mask layer over the structure in FIG. 8 to position the top of the T-shaped gate electrode 160 (i.e., the opening extends from over a portion of sacrificial spacer 310 that is in contact with the source electrode 170, the recess region 315, and over a portion of sacrificial spacer 310 that is in contact to the drain electrode 180). The gate material 161 may then be deposited to fill in this open area forming the vertical leg and horizontal cap of the T-shaped gate electrode 160, while the material deposited outside this region is removed with the removal of the temporary resist (e.g., PMMA) and/or hard mask layer.

Since the masking, patterning, and etching to form gate electrode 160 occurs independently from patterning of sacrificial spacer material 310, positioning of the top of the T-shaped gate electrode 160 may be unsymmetrical, so overhang region 165 may have a different length than the overhang region 166. In various embodiments, the overhang region 165 may be the same length as the overhang region 166, or the overhang region 165 may have a different length than the overhang region 166, where the difference in length between 165 and 166 may depend on the lateral control of the patterning process (e.g., e-beam, photolithography) of the sacrificial spacer material 310 and masking and patterning of gate electrode material 161.

In various embodiments, the gate electrode material may be doped silicon, silicides (e.g., NiSi, CoSi$_2$, TiSi$_2$, PtSi, WSi$_2$), Tungsten, (W), titanium (Ti), titanium nitride (TiN), palladium (Pd), gold (Au), nickel (Ni), molybdenum (Mo), etc., or combinations thereof.

Figure 11:
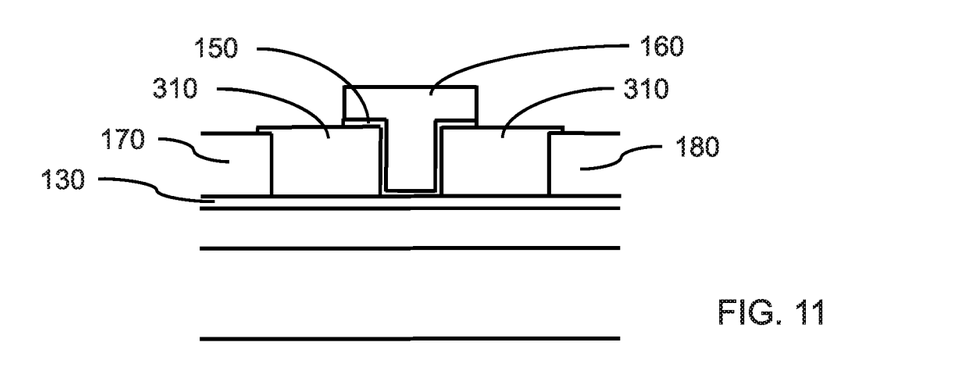
FIG. 11 is a side view of a partially fabricated NSM FET, as shown in FIG. 10, in accordance with an exemplary embodiment.

FIG. 11 is a side view of a partially fabricated NSM FET, as shown in FIG. 10.

In various embodiments, after patterning the gate electrode 160, the exposed gate dielectric layer 150 may be removed, for example, by wet etching or an anisotropic etch such as reactive ion etching (RIE), thereby exposing the underlying sacrificial spacer material 310, the source electrode 170, and the drain electrode 180.

Figure 12:
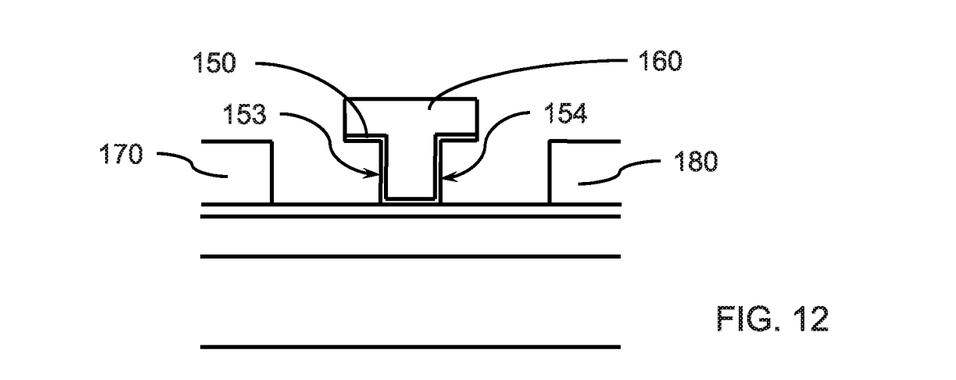
FIG. 12 is a side view of a partially fabricated NSM FET, as shown in FIG. 11, in accordance with an exemplary embodiment.

FIG. 12 is a side view of a partially fabricated NSM FET, as shown in FIG. 11.

In various embodiments, the sacrificial spacer material 310 may be removed by wet etching after being exposed. Hydrogen fluoride (HF) solution may be used to remove the SiO$_2$ formed by the cured HSQ. Removal of the sacrificial spacer material from between the source electrode 170 and the gate electrode 160, and between the drain electrode 180 and gate electrode forms voids exposing the sidewalls of the electrodes and gate dielectric layer 150. The voids may be gap regions 190, 191.

Figure 13:
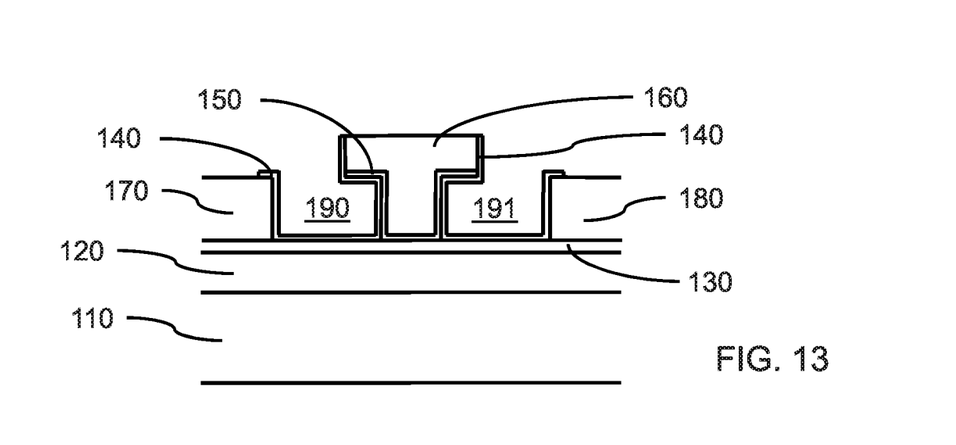
FIG. 13 is a side view of a partially fabricated NSM FET, as shown in FIG. 12, in accordance with an illustrative embodiment.

FIG. 13 is a side view of a partially fabricated NSM FET, as shown in FIG. 12.

In various embodiments, a doping layer 140 may be formed over the exposed surfaces of the source electrode, gate electrode, and drain electrode, as well as in the gap regions 190, 191, and over extension portions 145, 146. The doping layer 140 may create defects (e.g., traps) at the interface with the underlying NSM layer 130 that can trap and/or release charge carriers in the NSM layer 130. The doping layer 140 may dope the device to be n-type or p-type. In various embodiments, there is no undoped portion of the extension portions 145, 146. The n-type doping layer 140 may be benzyl viologen, silicon nitride (e.g., Si$_3$N$_4$), silicon oxynitride (e.g., SiON), magnesium oxide (MgO), aluminum oxide (Al$_2$O$_3$), hafnium oxide (e.g., HfO$_2$), hafnium silicate (e.g., HfSiO), hafnium silicon oxynitride (e.g., HfSiON), or combinations thereof. The stoichiometry of the materials may vary. The p-type doping layer 140 may be triethyloxonium hexachloroantimonate ((CH$_3$CH$_2$)O$^+$ SbCl$_6^-$), aluminum oxide (Al$_2$O$_3$), hafnium oxide (HfO$_2$), or combinations thereof.

In one or more embodiments, the doping layer 140 may be isotropically applied to the surfaces by ALD, CVD, or a wet deposition. The doping layer 140 may be formed directly on the NSM layer 130 extending at least from the sidewall of the source electrode 170 to a first sidewall 153 of the gate dielectric 150, and from a sidewall of the drain electrode 180 to a second sidewall 154 of the gate dielectric 150 opposite the first sidewall 153 of the gate dielectric. The doping layer 140 may have a thickness in the range of about 0.5 nm to about 20 nm, or in the range of about 1 nm to about 10 nm, or in the range of about 1 nm to about 5 nm.

In various embodiments, the doping layer 140 may be removed from the source electrode 170 and drain electrode 180. The doping layer 140 may be removed by masking portions of the device and etching the doping layer from at least the source electrode 170 and drain electrode 180 using a suitable etching process depending on the material composition of the doping layer 140.

FIG. 14 is a cross-sectional diagram of a NSM FET in accordance with another exemplary embodiment.

In various embodiments, the surface 125 of dielectric layer 120 may be functionalized to form functionalized surface layer 127. In various embodiments, a wetting layer 133 may be formed on at least a portion of the NSM layer 130 between the NSM layer 130 and the source electrode 170 and/or drain electrode 180.

In a non-limiting example of an embodiments, an NSM FET may be fabricated to have a gate electrode 160 with a bottom surface 162 having a width of about 100 nm and a top surface 168 having a width of 200 nm, thereby forming overhang regions 165, 166 each with lengths of about 50 nm. The vertical leg of the gate electrode has a height of about 50 nm and the horizontal cap has a height of about 50 nm. The gate electrode 160 is formed on a gate dielectric 150 having a thickness of 2 nm. The gate dielectric is formed over a NSM layer 130 that is a CNT monolayer about 1 nm thick, and a doping layer 140 having a thickness of about 3 nm is formed over at least the exposed portions of the NSM layer 130, and entirely covers extension portions 145, 146. The extension portions 145, 146 each have a length of about 70 nm, such that shadowed regions 147, 148 have a length of about 50 nm. The NSM layer is formed on dielectric layer 120, which is about 10 nm thick. A source electrode 170 having a height of about 20 nm and a drain electrode 180 having a height of about 20 nm are formed on the CNTs of the NSM layer.

Having described preferred embodiments of nano-structure material field effect transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A nanostructure material field effect transistor (FET) comprising:
   a dielectric layer on at least a portion of a substrate;
   a nano-structure material (NSM) layer on at least a portion of the dielectric layer;
   a source electrode and a drain electrode on at least a portion of the NSM layer;
   a gate dielectric on at least a portion of the NSM layer between the source electrode and the drain electrode silicon, wherein the material of the gate dielectric includes silicon oxide, silicon nitride, HfO$_2$, HfSiO$_4$, HfSiON, La$_2$O$_3$, Ta$_2$Os, ZrO$_2$, SrTiO$_3$, or combinations thereof;
   a T-shaped gate electrode between the source electrode and the drain electrode on the gate dielectric, wherein the NSM layer foiins a channel of the FET; and a doping layer directly on the NSM layer extending at least from the sidewall of the source electrode to a first sidewall of the gate dielectric, and at least from a sidewall of the drain electrode to a second sidewall of the gate dielectric.

2. The field effect transistor of claim 1, wherein the NSM layer includes carbon (C), boro-carbon nitrides (e.g., $BC_2N$), transition metal dichalcogenides, group IV semiconductors, II-VI semiconductors, or III-V semiconductors.

3. The field effect transistor of claim 1, wherein the NSM layer includes single-walled nanotubes (SWNTs), double-walled nanotubes (DWNTs), multi-walled nanotubes (MWNTs), chemically modified nanotubes, 2-dimensional lattice, or semiconducting nanowires.

4. The field effect transistor of claim 3, wherein the SWNTs, DWNTs, MWNTs, and chemically modified nanotubes are carbon SWNTs, carbon DWNTs, carbon MWNTs, chemically modified carbon nanotubes, and the 2-dimensional lattice is graphene.

5. The field effect transistor of claim 1, wherein the bottom surface of the T-shaped gate electrode has a width in the range of about 5 nm to about 500 nm, and the width of the top surface of the T-shaped gate electrode extends laterally a distance in the range of about 2 nm to about 100 nm greater than the width of the bottom surface of the T-shaped gate electrode to form overhang regions on opposite sides of the vertical leg of the T-shaped gate electrode, where the ratio of the width of the top surface to the width of the bottom surface is in the range of about 1.2:1 to about 5:1.

6. The field effect transistor of claim 1, wherein the doping layer includes benzyl viologen, silicon nitride, silicon oxynitride, magnesium oxide, aluminum oxide, hafnium oxide, hafnium silicate, hafnium silicon oxynitride, triethyloxonium hexachloroantimonate (($CH_3CH_2)O^+SbCl_6^-$), or combinations thereof.

7. The field effect transistor of claim 1, further comprising a gap region between and bounded by the T-shaped gate electrode, the NSM layer, and the source electrode on one side of the gate electrode, and a gap region between and bounded by the T-shaped gate electrode, the NSM layer, and the drain electrode on the opposite side of the gate electrode.

8. The field effect transistor of claim 1, further comprising a functionalized surface of the dielectric layer, and/or a wetting layer a portion of the NSM layer, where the functionalized surface increases adhesion of the NSM layer to the dielectric layer, and the wetting layer increases adhesion of the source electrode and drain electrode to the portion of the dielectric layer and/or NSM layer.

9. The field effect transistor of claim 1, further comprising an extension region between the T-shaped gate electrode and the source electrode, and an extension region between the T-shaped gate electrode and the drain electrode, wherein the doping layer covers the entire extension region between the source electrode and the T-shaped gate electrode, and the entire extension portion between the drain electrode and the T-shaped gate electrode.

10. A method of fabricating a nanostructure material field effect transistor (NSM FET) comprising:
    forming a NSM layer on at least a portion of dielectric layer;
    forming a source electrode and a drain electrode on at least a portion of the NSM layer;
    forming a gate dielectric on at least a portion of the NSM layer between the source electrode and the drain electrode;
    depositing gate electrode material on the gate dielectric layer;
    removing an upper portion of the gate electrode material to remove dimpling;
    patterning the gate electrode material to form a T-shaped gate electrode between the source electrode and the drain electrode on the gate dielectric, wherein the NSM layer forms a channel of the FET; and
    forming a doping layer directly on the surface of the NSM layer, where the doping layer extends at least from a sidewall of the source electrode to a first sidewall of the gate dielectric, and at least from a sidewall of the drain electrode to a second sidewall of the gate dielectric.

11. The method of fabricating the NSM FET of claim 10, wherein the NSM layer includes carbon (C), boro-carbon nitrides (e.g., $BC_2N$), transition metal dichalcogenides, group IV semiconductors, II-VI semiconductors, or III-V semiconductors.

12. The method of fabricating the NSM FET of claim 10, wherein the NSM layer includes single-walled nanotubes (SWNTs), double-walled nanotubes (DWNTs), multi-walled nanotubes (MWNTs), chemically modified nanotubes, 2-dimensional lattice, or semiconducting nanowires.

13. The field effect transistor of claim 12, wherein the SWNTs, DWNTs, MWNTs, and chemically modified nanotubes are carbon SWNTs, carbon DWNTs, carbon MWNTs, chemically modified carbon nanotubes, and the 2-dimensional lattice is graphene.

14. The method of fabricating the NSM FET of claim 10, wherein the NSM layer is formed by a wet method, where nano-structure material is deposited from a solution.

15. The method of fabricating the NSM FET of claim 10, further comprising functionalizing the surface of the dielectric layer to increase adhesion of the NSM layer, and/or forming a wetting layer on at least a portion of the NSM layer to increase adhesion of the source and drain electrodes.

16. The method of fabricating the NSM FET of claim 15, wherein the doping layer includes benzyl viologen, silicon nitride, silicon oxynitride, magnesium oxide, aluminum oxide, hafnium oxide, hafnium silicate, hafnium silicon oxynitride, triethyloxonium hexachloroantimonate (($CH_3CH_2)O^+SbCl_6^-$), or combinations thereof.

17. The method of fabricating the NSM FET of claim 10, wherein the doping layer is isotropically applied by ALD, CVD, or a wet deposition.

18. The method of fabricating the NSM FET of claim 10, wherein a first extension region is formed between the T-shaped gate electrode and the source electrode, and a second extension region is formed between the T-shaped gate electrode and the drain electrode, wherein the doping layer covers the entire extension region between the source electrode and the T-shaped gate electrode, and the entire extension portion between the drain electrode and the T-shaped gate electrode.

19. A method of fabricating a nanostructure material field effect transistor (NSM FET) comprising:
    forming a dielectric layer on at least a portion of a substrate;
    forming a NSM layer on at least a portion of dielectric layer, wherein the NSM layer includes single-walled carbon nanotubes (SWNTs), double-walled carbon nanotubes (DWNTs), multi-walled carbon nanotubes (MWNTs), chemically modified carbon nanotubes, or graphene;
    patterning the NSM layer to leave gaps between adjacent sections of NSM material to fin in a plurality of isolated active areas;

forming a source electrode and a drain electrode on at least a portion of the NSM layer forming an isolated active area;

forming a gate dielectric on the portion of the NSM layer between the source electrode and the drain electrode;

depositing gate electrode material on the gate dielectric layer;

removing an upper portion of the gate electrode material to remove dimpling;

patterning the gate electrode material to form a T-shaped gate electrode between the source electrode and the drain electrode on the gate dielectric, wherein the NSM layer forms a channel of the FET; and forming a doping layer directly on the surface of the NSM layer, where the doping layer extends at least from a sidewall of the source electrode to a first sidewall of the gate dielectric, and at least from a sidewall of the drain electrode to a second sidewall of the gate dielectric.

20. The method of fabricating the NSM FET of claim 19, further comprising:

forming the T-shaped gate electrode by forming sacrificial spacer material on exposed portions of the NSM layer;

depositing the gate dielectric over the sacrificial spacer material and the NSM layer;

depositing T-shaped gate electrode material on the gate dielectric;

patterning and removing the T-shaped gate electrode material and the gate dielectric to form a gate electrode having a bottom surface, and a top surface with a width and surface area greater than the bottom surface of the T-shaped gate electrode; and removing the sacrificial spacer material.

\* \* \* \* \*